(12) United States Patent
Joh et al.

(10) Patent No.: US 11,177,378 B2
(45) Date of Patent: Nov. 16, 2021

(54) HEMT HAVING CONDUCTION BARRIER BETWEEN DRAIN FINGERTIP AND SOURCE

(71) Applicant: TEXAS INSTRUMENTS INCORPORATED, Dallas, TX (US)

(72) Inventors: Jungwoo Joh, Allen, TX (US); Naveen Tipirneni, Plano, TX (US); Chang Soo Suh, Allen, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 8 days.

(21) Appl. No.: 16/895,111

(22) Filed: Jun. 8, 2020

(65) Prior Publication Data

US 2020/0303535 A1  Sep. 24, 2020

Related U.S. Application Data

(60) Continuation of application No. 15/864,157, filed on Jan. 8, 2018, now Pat. No. 10,680,093, which is a
(Continued)

(51) Int. Cl.
*H01L 29/778* (2006.01)
*H01L 21/265* (2006.01)
*H01L 21/266* (2006.01)
*H01L 21/308* (2006.01)
*H01L 29/06* (2006.01)
(Continued)

(52) U.S. Cl.
CPC ........ *H01L 29/7786* (2013.01); *H01L 21/266* (2013.01); *H01L 21/2654* (2013.01); *H01L 21/3083* (2013.01); *H01L 29/0646* (2013.01); *H01L 29/0653* (2013.01); *H01L 29/0657* (2013.01); *H01L 29/0843* (2013.01);
(Continued)

(58) Field of Classification Search
CPC ............ H01L 29/7786; H01L 29/0657; H01L 21/3083; H01L 29/0646; H01L 29/0653; H01L 21/266; H01L 29/0843; H01L 29/2003; H01L 29/41758; H01L 29/66462; H01L 21/2654
See application file for complete search history.

(56) References Cited

U.S. PATENT DOCUMENTS

5,313,083 A   5/1994 Schindler
8,933,486 B2  1/2015 Wu
(Continued)

*Primary Examiner* — Edward Chin
(74) *Attorney, Agent, or Firm* — Andrew R. Ralston; Charles A. Brill; Frank D. Cimino (57) ABSTRACT

A High Electron Mobility Transistor (HEMT) includes an active layer on a substrate, and a Group IIIA-N barrier layer on the active layer. An isolation region is through the barrier layer to provide at least one isolated active area including the barrier layer on the active layer. A gate is over the barrier layer. A drain includes at least one drain finger including a fingertip having a drain contact extending into the barrier layer to contact to the active layer and a source having a source contact extending into the barrier layer to contact to the active layer. The source forms a loop that encircles the drain. The isolation region includes a portion positioned between the source and drain contact so that there is a conduction barrier in a length direction between the drain contact of the fingertip and the source.

20 Claims, 9 Drawing Sheets

Related U.S. Application Data division of application No. 15/353,857, filed on Nov. 17, 2016, now Pat. No. 9,882,041.

(51) Int. Cl.
*H01L 29/08* (2006.01)
*H01L 29/20* (2006.01)
*H01L 29/417* (2006.01)
*H01L 29/66* (2006.01)

(52) U.S. Cl.
CPC .... *H01L 29/2003* (2013.01); *H01L 29/41758* (2013.01); *H01L 29/66462* (2013.01)

(56) References Cited

U.S. PATENT DOCUMENTS

| | | |
|---|---|---|
| 9,054,027 B2 | 6/2015 | Pendharkar et al. |
| 9,337,023 B1 | 5/2016 | Fareed et al. |
| 9,882,041 B1 * | 1/2018 | Joh ................ H01L 29/0646 |
| 2012/0032232 A1 | 2/2012 | Iwabuchi et al. |
| 2012/0280280 A1 | 11/2012 | Zhang |
| 2013/0228788 A1 | 9/2013 | Yamamura |
| 2014/0327011 A1 * | 11/2014 | Pendharkar ....... H01L 29/42316 257/76 |

* cited by examiner

HEMT HAVING CONDUCTION BARRIER BETWEEN DRAIN FINGERTIP AND SOURCE

CROSS REFERENCE TO RELATED APPLICATIONS

This application is a continuation of U.S. patent application Ser. No. 15/864,157, filed Jan. 8, 2018, issued as U.S. Ser. No. 10/680,093B1, which is a divisional of U.S. patent application Ser. No. 15/353,857, filed Nov. 17, 2016, issued as U.S. Pat. No. 9,882,041B1, both of which are incorporated herein by reference in their entireties.

FIELD

Disclosed embodiments relate to Group IIIA-N (e.g., Gallium Nitride) High Electron Mobility Field Effect Transistors (HEMTs).

BACKGROUND

Gallium-nitride (GaN) is a commonly used Group IIIA-N material for electronic devices, where Group IIIA elements such as Ga (as well as boron, aluminum, indium, and thallium) are also sometimes referred to as Group 13 elements. GaN is a binary IIIA/V direct band gap semiconductor that has a Wurtzite crystal structure. Its relatively wide band gap of 3.4 eV at room temperature (vs. 1.1 eV for silicon at room temperature) affords it special properties for a wide variety of applications in optoelectronics, as well as high-power and high-frequency electronic devices.

GaN-based HEMTs are known which feature a junction between two materials with different band gaps to form a heterojunction or heterostructure. The HEMT structure is based on a very high electron mobility, described as a two-dimensional electron gas (2DEG) which forms just below a heterostructure interface between a barrier layer (that typically comprises AlGaN) on a generally intrinsic active layer (that typically comprises GaN) due to the piezoelectric effect and a natural polarization effect. As with any power FET device, there are a gate, source electrode, and drain electrode, where the source electrode and drain electrode each include contacts that extend through the top barrier layer to form an ohmic contact with the underlying 2DEG in the surface of the active layer. One Group IIIA-N HEMT layout is a drain centered layout where the high voltage drain area is completely enclosed by the gate and by the source. This layout has advantages including regarding device isolation, edge termination, and leakage current control.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize for drain centered Group IIIA-N HEMT during device operation near the drain contact of the fingertip of the drain finger there is generally a high concentration of 'hot' carriers that can degrade and destroy (e.g., melt) the device especially under high power switching conditions. By providing an isolation region that is through the barrier layer around the drain contact fingertip of the drain finger so that there is a resulting conduction barrier provided in a length direction of the drain finger between the drain contact of the fingertip and the source, the conduction barrier suppresses the hot carrier injection problem, thus improving device robustness and reliability.

The isolation region can be formed by patterning the barrier layer to form an active area Mesa structure having adjacent conduction barriers, or can comprise an implanted isolation region with no need for etching the barrier layer. In the case of an active area Mesa having an adjacent conduction barrier, the Mesa boundary can be rounded by using a greyscale mask to suppress leakage or breakdown that may otherwise occur along the Mesa edge.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1A:
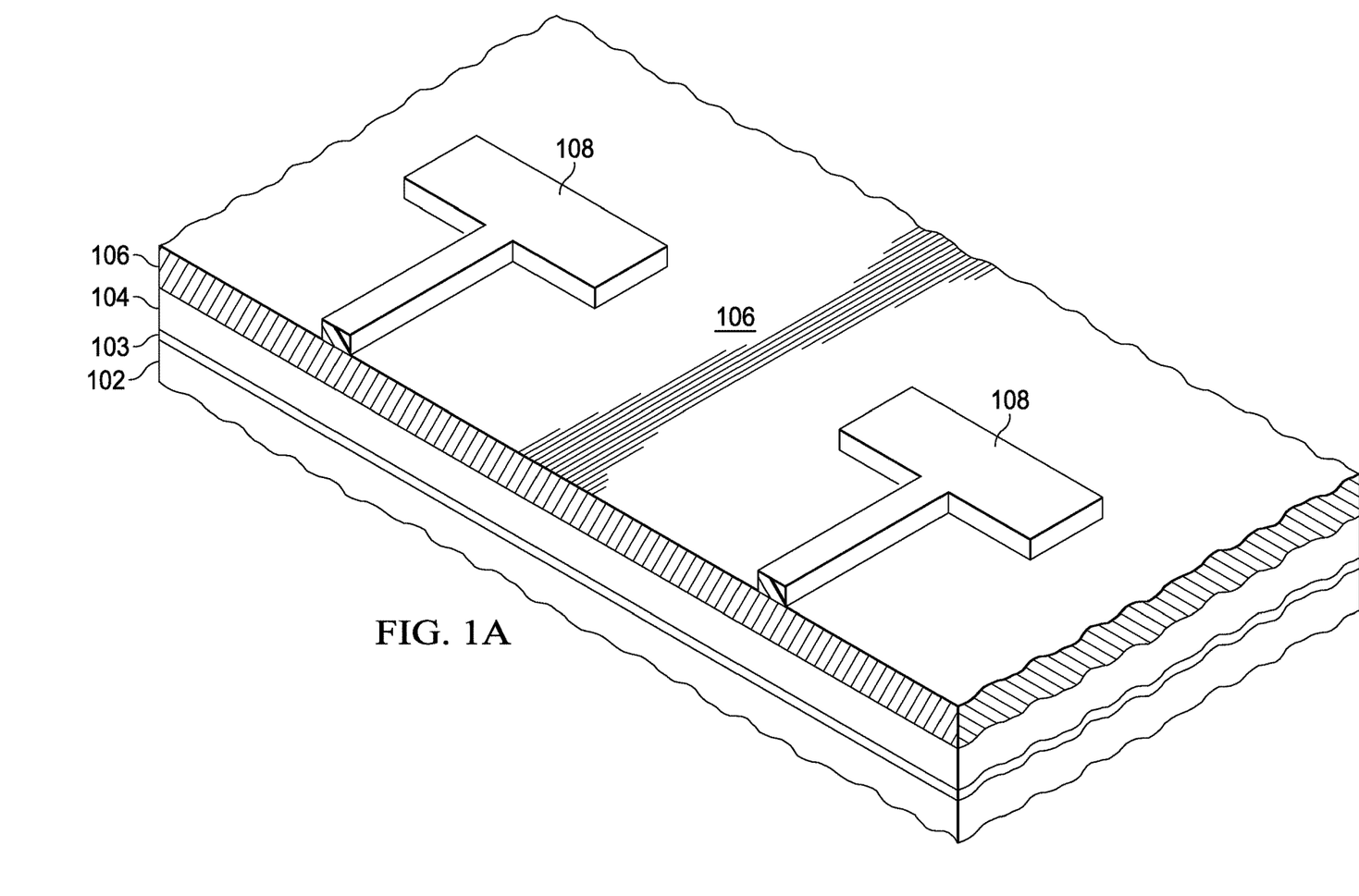
FIGS. 1A-C provide successive top perspective cross sectional views that correspond to steps in an example method for forming a Group IIIA-N HEMT having an isolation region including a portion positioned between the source and the drain contact so that there is a conduction barrier in a length direction of the drain finger between the drain contact fingertip and the source, according to an example embodiment. The view in FIG. 1C is rotated 180 degrees from the views shown in FIGS. 1A and 1B, and is only showing a portion of the active areas shown in FIGS. 1A and 1B.
Figure 1B:
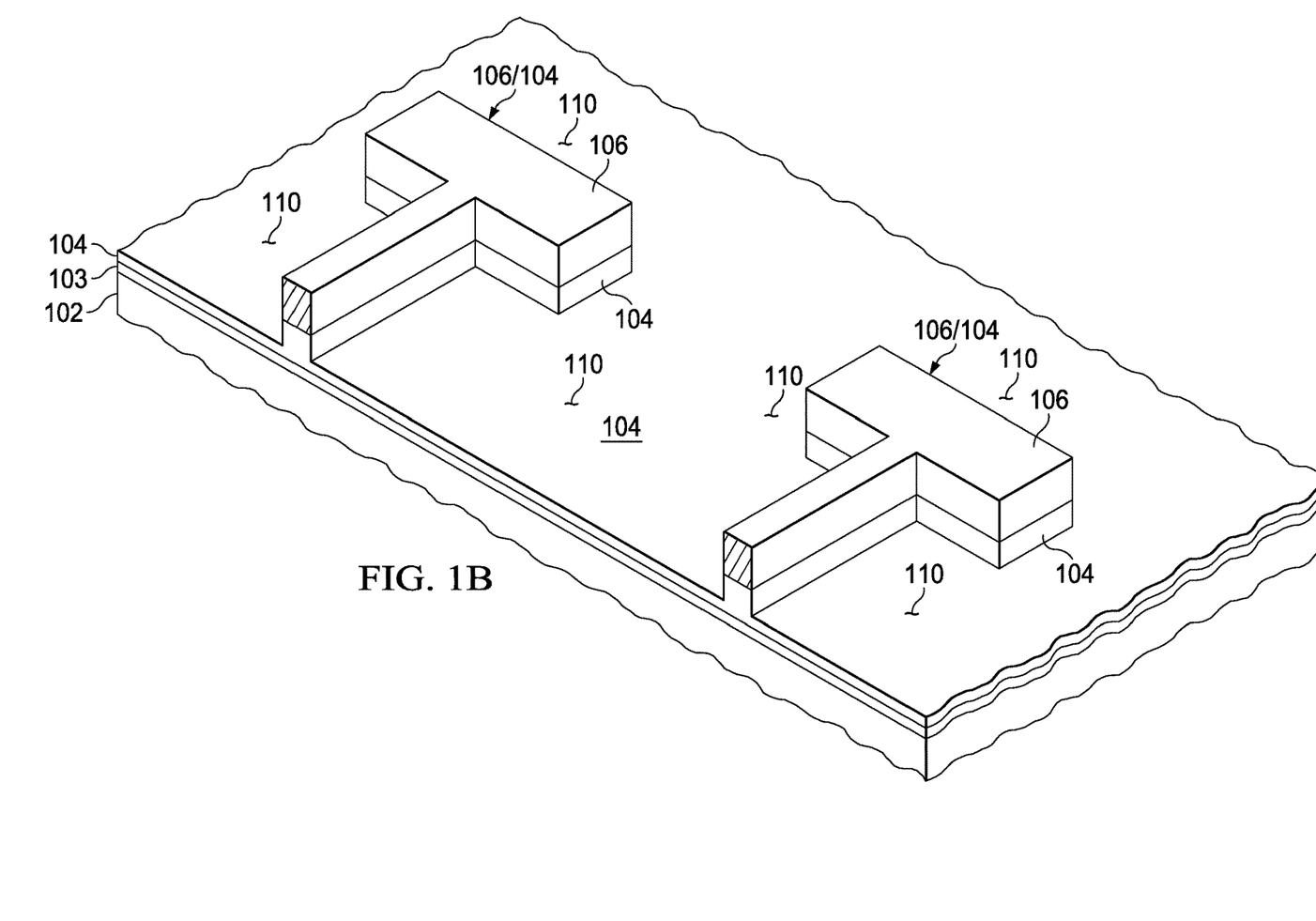
Figure 1C:
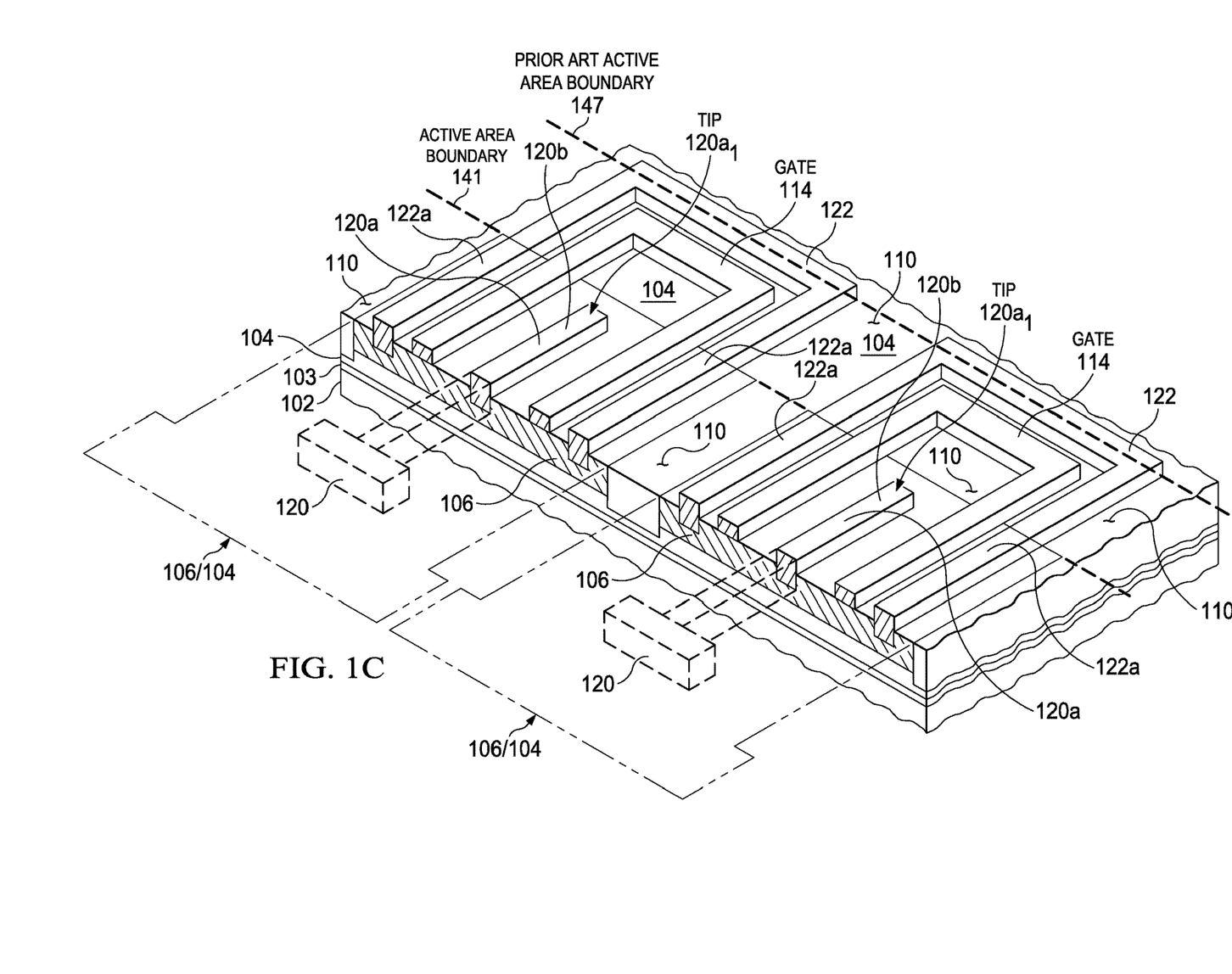

FIGS. 1A-C provide successive top perspective cross sectional views that correspond to steps in an example method for forming a disclosed Group IIIA-N HEMT having an isolation region including a portion positioned between the source and the drain contact so that there is a conduction barrier in a length direction of the drain contact of the drain contact fingertip and the source, according to an example embodiment. As noted above, the view in FIG. 1C is rotated 180 degrees from the view shown in FIGS. 1A and 1B, and is only showing a portion of the active areas shown in FIGS. 1A and 1B.

An in-process HEMT is shown in FIG. 1A comprising a substrate 102, at least one Group IIIA-N buffer layer 103 on the substrate 102, a Group IIIA-N active layer 104 on the buffer layer 103, and a Group IIIA-N barrier layer 106 on the active layer 104. As known in the art, a 2DEG is formed in the active layer 104 near its heterojunction throughout its interface with the barrier layer 106. The barrier layer 106, the active layer 104 and the buffer layer 103 are generally all epitaxial layers on the substrate 102. A patterned masking material 108 (e.g., photoresist) is shown on the barrier layer 106 that is used to define the isolation regions 110 which defines the active areas. The T-shape pattern shape shown is only for example.

The substrate 102 can comprises sapphire, silicon, silicon carbide (SiC) or GaN. The Group IIIA-N buffer layer 103 is generally present on the substrate 102, but is not needed when a gallium nitride (GaN) substrate is used. The active layer 104 can comprise, for example, 25 to 1,000 nanometers of GaN. The active layer 104 may be formed so as to minimize crystal defects which may have an adverse effect on electron mobility. The active layer 104 is commonly undoped (e.g., undoped GaN).

The barrier layer 106 can comprise, for example, 8 to 30 nanometers of $Al_xGa_{1-x}N$ or $In_xAl_yGa_{1-x-y}N$. A composition of Group IIIA elements in the barrier layer 106 may be, for example, 24 to 28 percent atomic weight aluminum nitride and 72 to 76 percent atomic weight gallium nitride. Forming the barrier layer 106 on the active layer 104 generates a 2DEG in the active layer 104 throughout its interface with the barrier layer 106 just below the barrier layer 106, with an electron density of, for example, $1 \times 10^{12}$ to $2 \times 10^{13}$ $cm^{-2}$. The barrier layer 106 may include an optional capping layer, for example comprising GaN, on a top surface of the barrier layer 106.

The patterned masking material 108 functioning as an isolation mask is used to form isolation regions 110 that define at least isolated active area from the barrier layer 106 and active layer 104, with the results shown in FIG. 1B showing two active area 106/104. FIG. 1B shows isolation regions 110 that lack the barrier layer 106 which surround an isolated active area 106/104 having the barrier layer 106 on the active layer 104 to provide the 2DEG. The isolation mask using the patterned masking material 108 may include, for example, 200 nanometers to 2 microns of photoresist formed by a photolithographic process. The forming the isolation regions 110 can comprises a Mesa etch process. For example, a blanket barrier layer 106 can be patterned using a greyscale mask followed by an etch to provide rounded edges. As shown in FIG. 1B, this Mesa etch process besides etching through the barrier layer 106 also removes a portion of the active layer 104.

As known in the art, using a greyscale mask enables micro-lithographers to shape resist using a single exposure with a custom attenuating mask comprised of sub-resolution pixels. The isolation process using patterned masking material 108 may also be an isolation implant(s) which selectively implants dopants into the barrier layer 106 and into the active layer 104 to form a heavily doped isolation barrier. In either case the isolation region 110 functions as a conduction barrier that reduces or eliminates electrical current in the 2DEG from crossing therethrough.

A gate 114, drain contact 120b and a source 122 with source contact 122a are formed within the active areas 106/104 with the results shown in FIG. 1C for a portion of active areas 106/104 that include a portion of a drain contact 120b with its drain finger 120a including the drain fingertip 120a1 and a portion of the source 122 and source contact 122a shown. As noted above, the view in FIG. 1C is rotated 180 degrees from the view shown in FIGS. 1A and 1B, and each active area 106/104 is only a portion of what is shown in FIGS. 1A and 1B. The gate 114 is shown formed over the barrier layer 106. The source contacts and drain contacts are generally formed by a masked etch process that selectively etches part of the thickness of the barrier layer 106 to extend into the barrier layer 106 to provide good (low resistance) contact to the 2DEG in the active layer 104 near the interface between the barrier layer 106 and the active layer 104.

Figure 2:
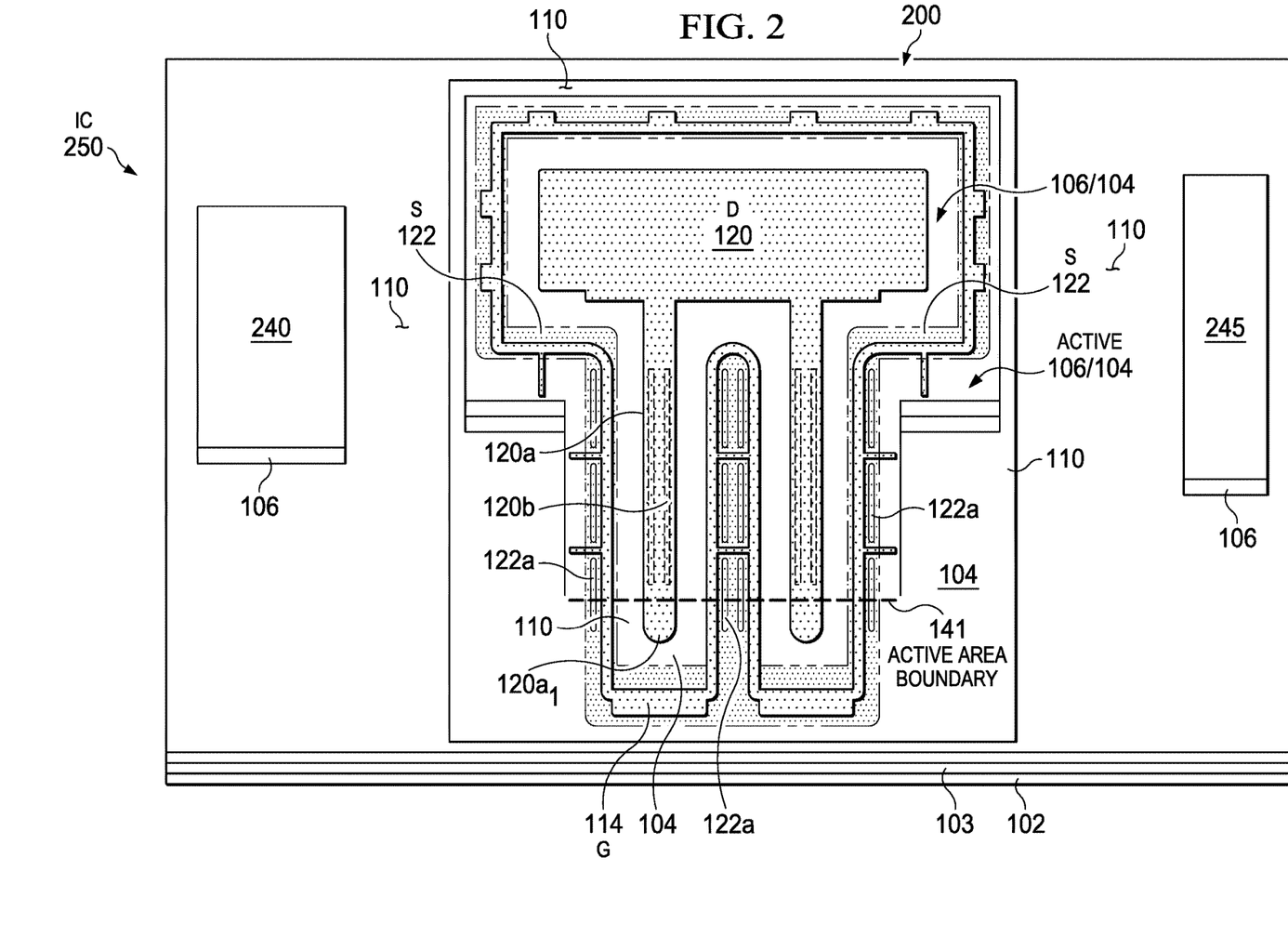
FIG. 2 is a top view of a Group IIIA-N HEMT having a drain fingertip on an isolation region, according to an example embodiment.

Although not shown in the view provided, the source 122 forms a complete loop that encircles the drain (see FIG. 2 for a source 122 providing encirclement of the drain 120). In FIG. 1C an example active area boundary 141 is shown as well as the position of a known (prior art) active area boundary 147. The position of the active area boundary 141 results in the fingertip $120a_1$ being over isolation region 110 including an isolation region portion positioned between the source 122 and the drain contact 120b so that there is a conduction barrier in a length direction of the drain contact 120b in the drain finger 120a between the drain contact of the fingertip $120a_1$ and the source 122. In contrast, the position of the known active area boundary 147 results in the fingertip $120a_1$ being over the active area 106/104 so that there is no conduction barrier in a length direction of the drain contact 120b in the drain finger 120a between the drain contact of the fingertip $120a_1$ and the source 122, which undesirably results in hot carriers flowing between the source 122 and the drain contact 120b in the fingertip 120a during device operation as described above.

The gate 114, drain including drain contact 120b and the source including the source contact 122a all generally comprise a metal, such as a TiW alloy in one particular embodiment. The respective electrodes can be formed by sputtering a metal stack, such as Ti/Al/TiN in another particular embodiment. Although not shown in FIG. 1C, the source and the drain metal layers are generally on top of a dielectric layer that is on top of the barrier layer 106 and over the gate to prevent shorts to the gate.

FIG. 2 is a top view of an integrated circuit (IC) 250 including a 2-finger Group IIIA-N HEMT 200 having an isolation region 110 including an isolation portion positioned between the source 122 and the drain contact 120*b* of the drain 120 so that there is a conduction barrier in a length direction of the drain contact 120*b* in the drain fingers 120*a* between their fingertip 120*a*1 and the source 122, according to an example embodiment. IC 250 also includes other circuitry shown as blocks 240 and 245 on another active area 106/104, such as for realizing a DC/DC power converter IC. Although not explicitly shown in FIG. 2 (as well as FIGS. 3A-3D), there is electrical isolation between the metal providing the gate 114 and the source 122. In one embodiment there is a dielectric layer over the metal of the gate 114, where the metal of the source 122 is on top of the dielectric layer on the gate metal to form field plates. In another embodiment, there is a spacing between the metal of the source 122 and the gate 114 so that this dielectric layer between the source and gate metal is not needed.

The area of the drain 120 is shown completely enclosed by both the gate 114 and by the source 122. The active area 106/104 can be seen to be enclosed by the isolation region 110 which includes only active layer 104 (no barrier layer 106). The active area 106/104 in this embodiment can comprise a Mesa (raised in height due to unremoved barrier layer 106 on the active layer 104) as compared to the isolation region 110 which in the Mesa embodiment lacks at least the barrier layer 106. The gate is 114. The example active area boundary 141 (also in FIG. 2) is shown below the drain contact 120*b*.

Figure 3A:
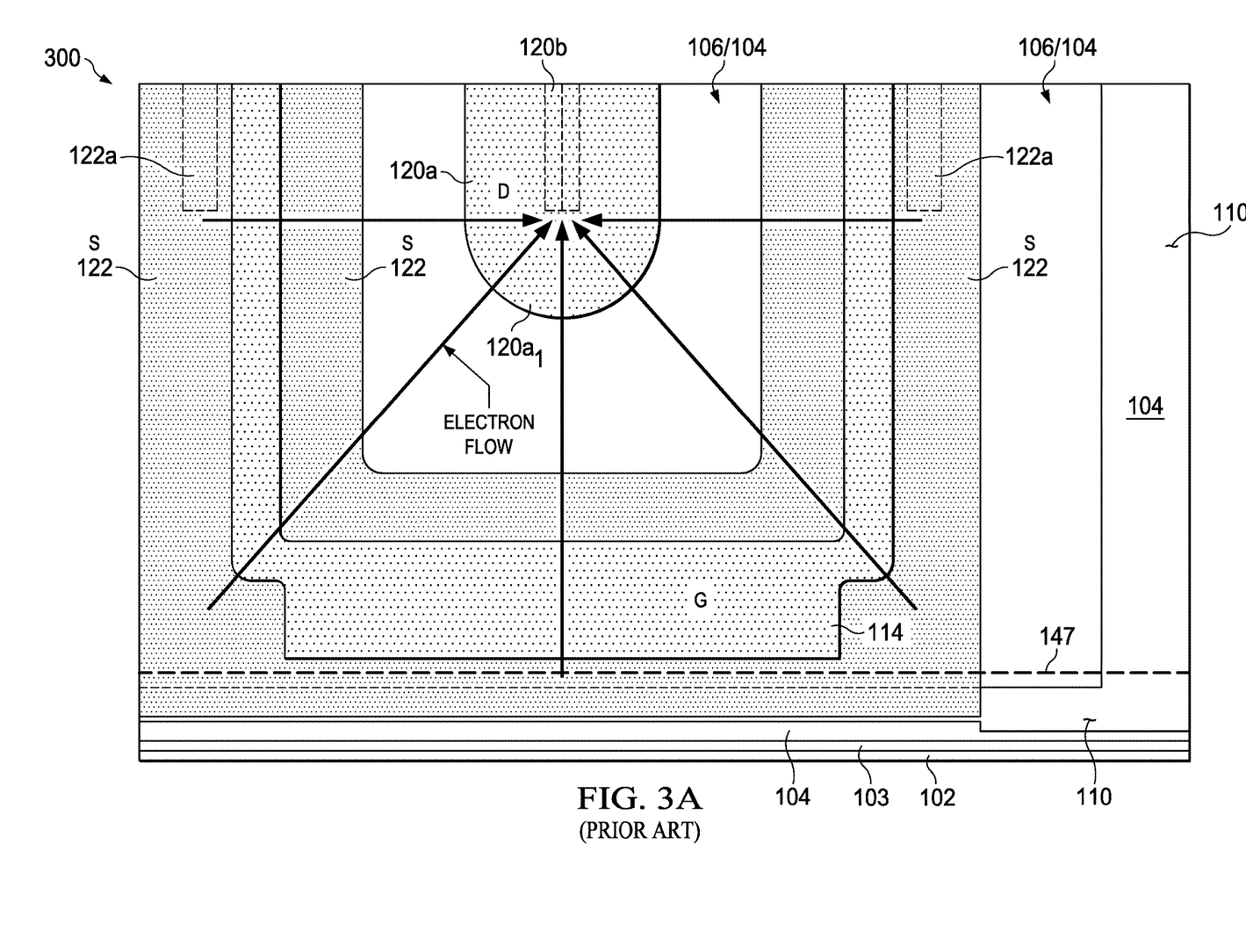
FIG. 3A is a zoomed in top view of a portion of a known Group IIIA-N HEMT having a drain centered layout.

FIG. 3A is a zoomed in top view of a portion of a known Group IIIA-N HEMT 300 (marked prior art) having a drain centered layout. Electron flow during operation of HEMT 300 is shown by the arrows extending in a 180 degree arc in a path from the source 122 to the drain contact 120*b* in the fingertip 120*a*1 of the drain finger 120*a*. This electron flow pattern is recognized to result in a high concentration of 'hot' carriers that can degrade and destroy (e.g., melt) the HEMT device especially under high current switching conditions.

Figure 3B:
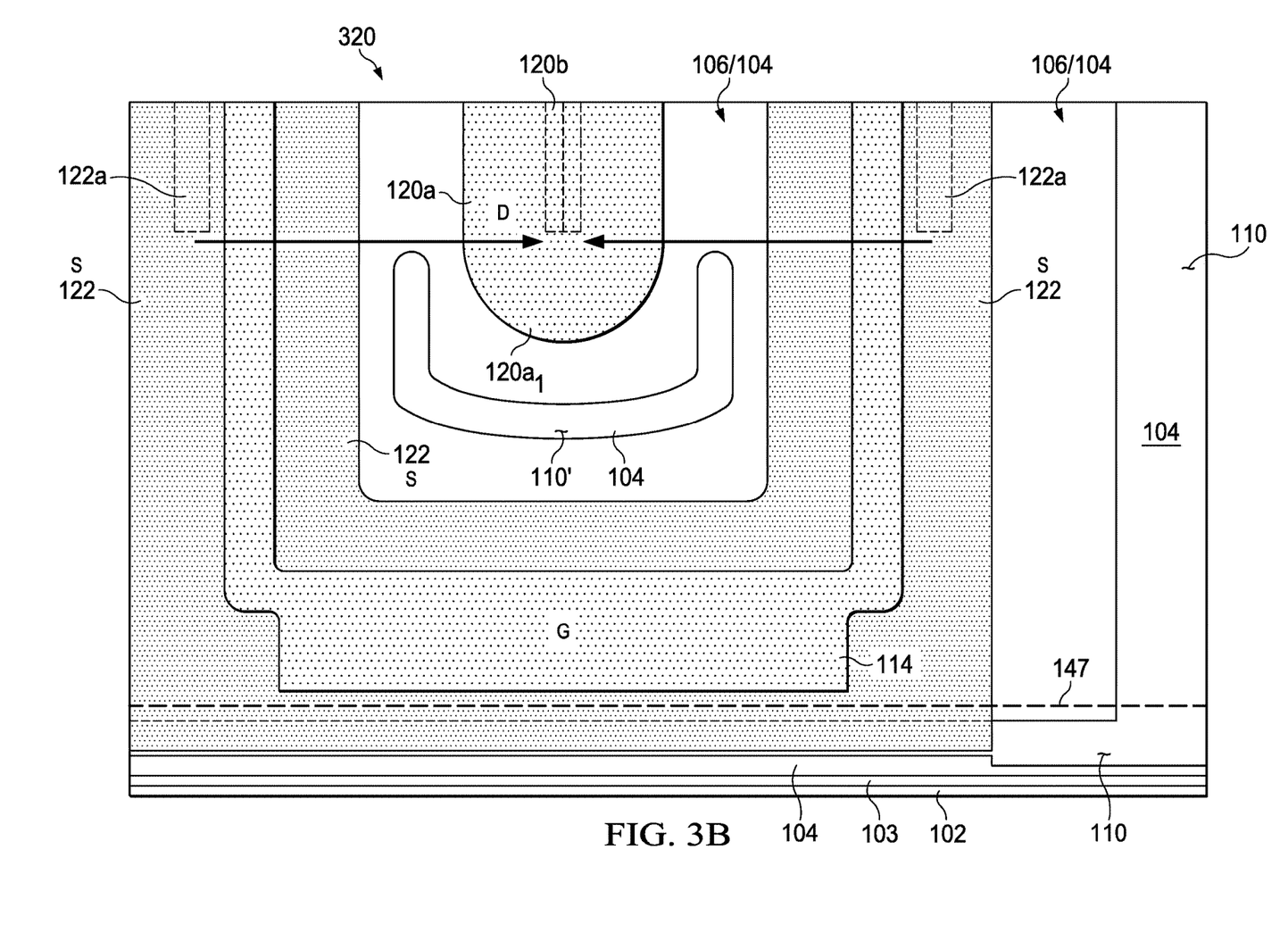
FIG. 3B is a zoomed in top view of a portion of a first example Group IIIA-N HEMT having a drain centered layout with an isolation region including a portion positioned between the source and the drain contact so that there is a conduction barrier in a length direction of the drain finger between the drain contact of the fingertip and the source.

FIG. 3B is a zoomed in top view of a portion of a Group IIIA-N HEMT 320 having a drain centered layout with an isolation region 110 including an isolation region portion 110' positioned between the source 122 and the drain contact 120*b* so that there is a conduction barrier in a length direction of the drain finger 120*a* between drain contact 120*b* of the fingertip 120*a*1 and the source 122. By providing an isolation region portion 110' that is through the barrier layer 106 to expose at least the active layer 104 around the fingertip 120*a*1 of the drain finger 120*a* so that there is a resulting conduction barrier provided in a length direction of the drain finger between the drain contact 120*b* of the fingertip 120*a*1 and the source 122, the conduction barrier suppresses the hot carrier injection problem, thus improving device robustness and reliability. The conduction barrier 110' is shown blocking conduction through at least a 150 degree arc in a path from the source 122 to the drain contact 120*b* of the fingertip 120*a*1.

Figure 3C:
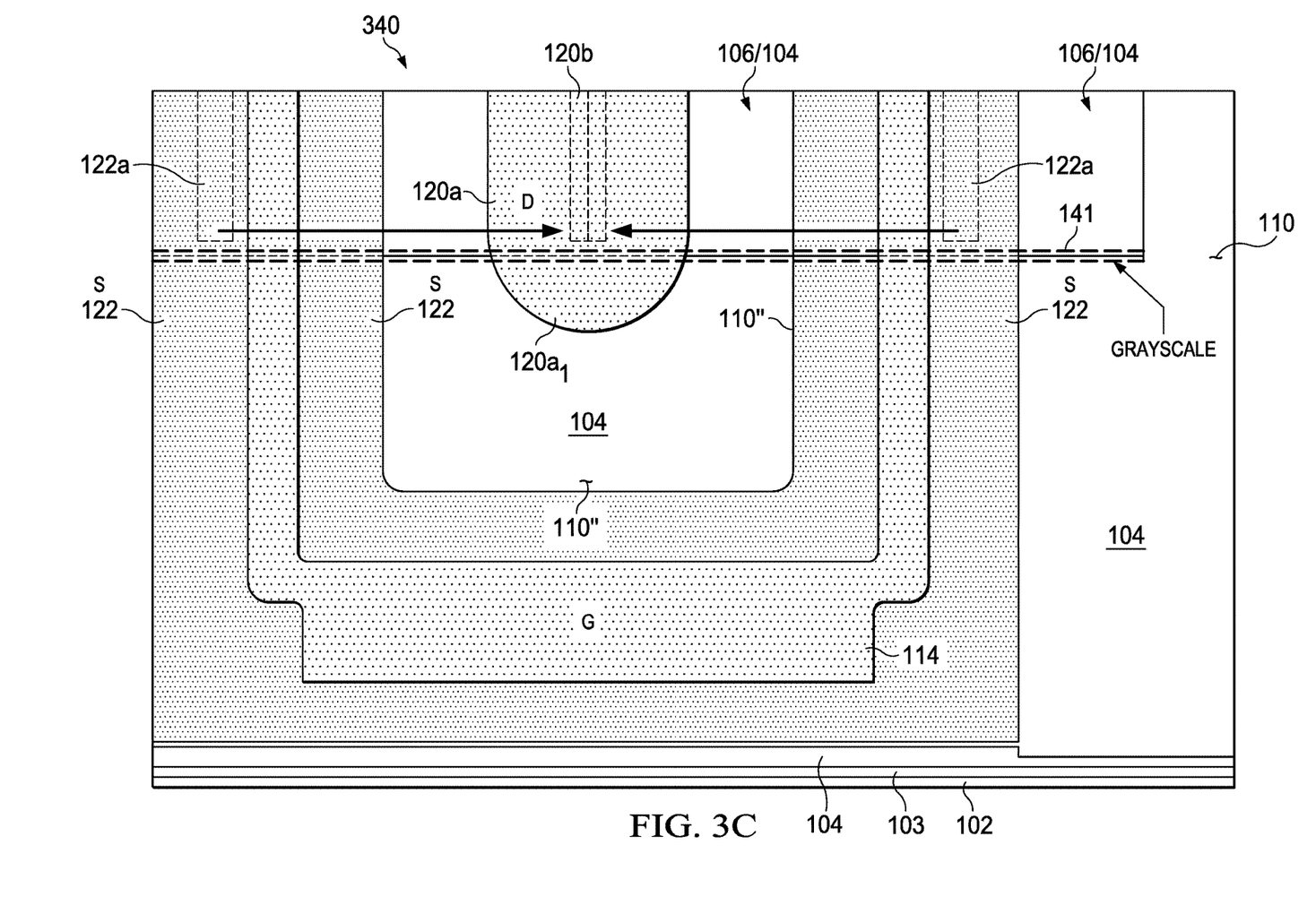
FIG. 3C is a zoomed in top view of a portion of a second example Group IIIA-N HEMT having a drain centered layout with an isolation region including a portion positioned between the source and the drain contact so that there is a conduction barrier in a length direction of the drain finger between the drain contact of the fingertip and the source.

FIG. 3C is a zoomed in top view of a portion of a Group IIIA-N HEMT 340 having a drain centered layout with an isolation region 110 including an isolation region portion 110" positioned between the source 122 and the drain contact 120*b* so that there is a conduction barrier in a length direction of the drain finger 120*a* between the drain contact 120*b* of the fingertip 120*a*1 and the source 122. The pulled back position of the active area boundary 141 results in the isolation cut line and thus the isolation region portion 110" being separated from, shown being below, the drain contact 120*b*. By providing an isolation region portion 110' that is through the barrier layer 106 to expose the active layer 104 around the fingertip 120*a*1 of the drain finger 120*a* so that there is a resulting conduction barrier 110" provided in a length direction of the drain finger between the drain contact 120*b* of the fingertip 120*a*1 and the source 122, the hot carrier injection problem is suppressed, thus improving device robustness and reliability.

Figure 3D:
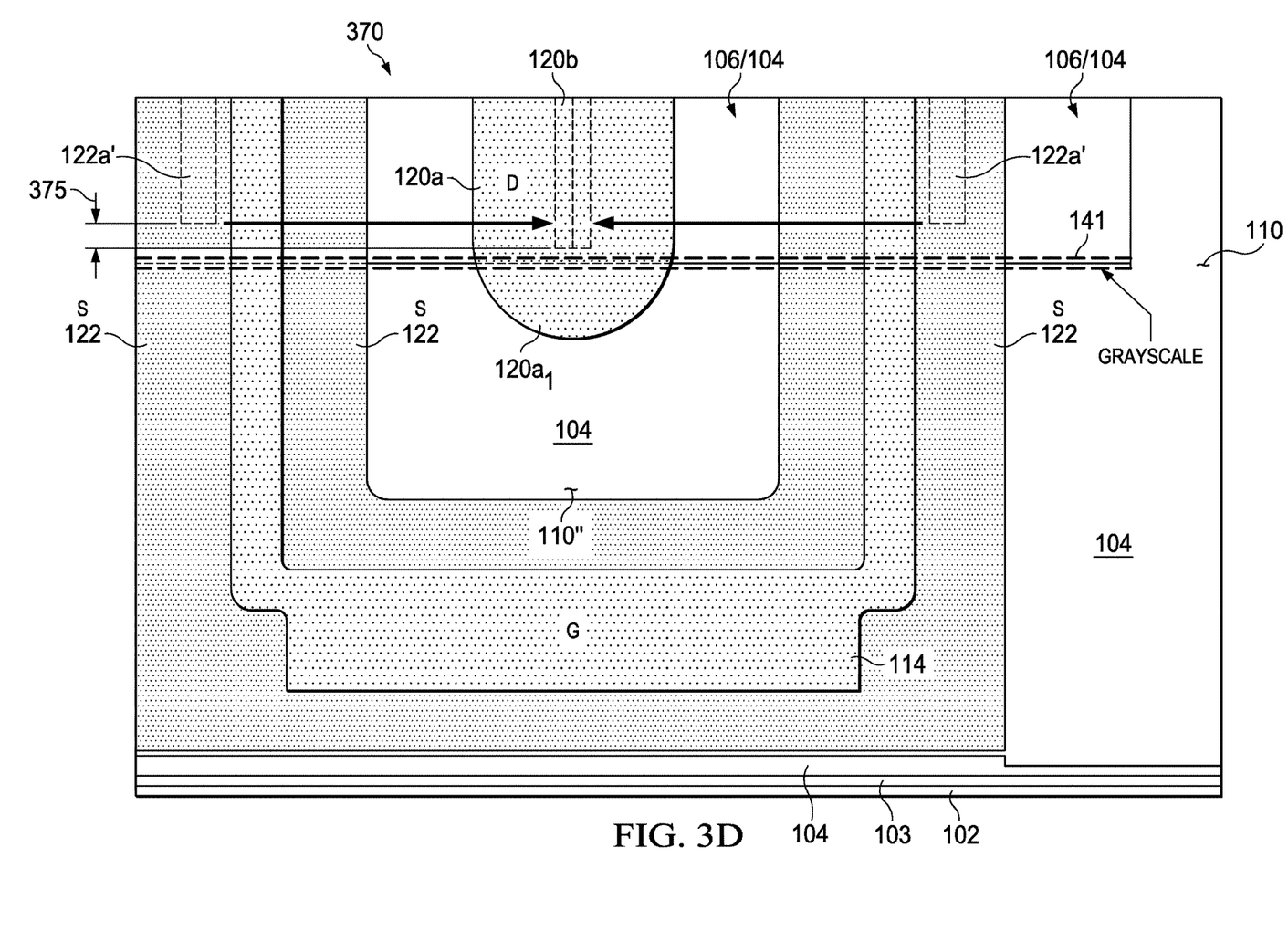
FIG. 3D is a zoomed in top view of a portion of another Group IIIA-N HEMT having a drain centered layout with an isolation region including an isolation region portion positioned between the source and the drain contact so that there is a conduction barrier in a length direction of the drain finger between the drain contact of the fingertip and the source. The HEMT features its drain contact extending in the length direction of the drain finger beyond the source contact to further suppress the current crowding effect.

FIG. 3D is a zoomed in top view of a portion of another Group IIIA-N HEMT 370 having a drain centered layout with an isolation region 110 including an isolation region portion 110" positioned between the source 122 and the drain contact 120*b* so that there is a conduction barrier in a length direction of the drain finger 120*a* between the drain contact 120*b* in the fingertip 120*a*1 and the source 122. As in FIG. 3C, the pulled back position of the active area boundary 141 results in the isolation cut line and thus the isolation region portion 110" being separated from, shown being below, the drain contact 120*b*. HEMT 370 features its drain contact 120*b* extending in the length direction of the drain finger 120*a* beyond the source contact 122*a* to further suppress the current crowding effect, and is otherwise analogous to the HEMT 340 shown in FIG. 3C. The drain contact extension distance shown as 375 can be from about 1 μm to about 100 μm.

Disclosed HEMTs apply to both enhancement and depletion mode devices. Disclosed HEMTs can be embodied as discrete devices or on ICs such as power converters (e.g., DC/DC converters) and power switches.

EXAMPLES

Disclosed embodiments are further illustrated by the following specific Examples, which should not be construed as limiting the scope or content of this Disclosure in any way.

Figure 4:
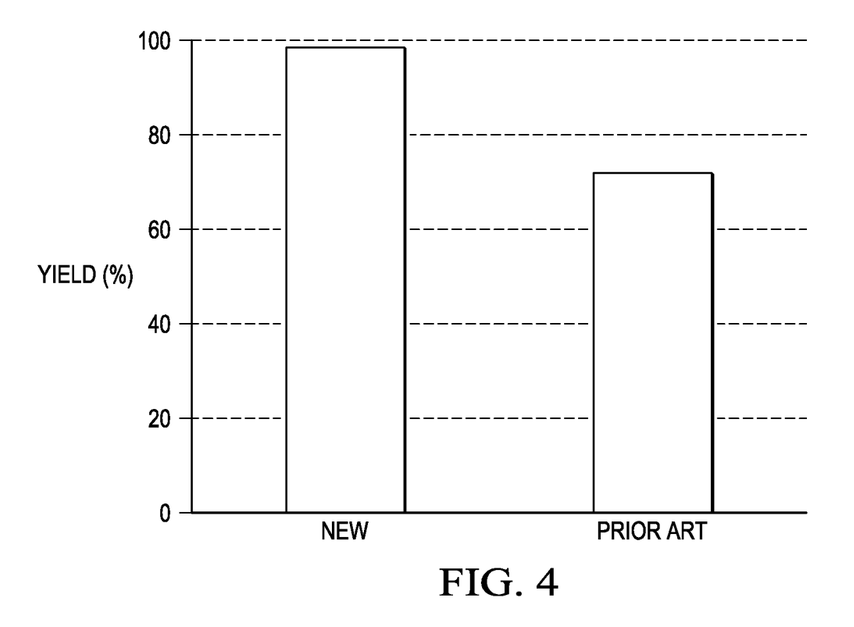
FIG. 4 shows actual 600V hard switching yield data that compares results from a Group IIIA-N HEMT having a known drain centered layout and a disclosed Group IIIA-N HEMT having a drain centered layout with a drain contact on an isolation region including a portion positioned between the source and the drain contact so that there is a conduction barrier in a length direction of the drain finger between the drain contact fingertip and the source.

FIG. 4 shows actual 600V hard switching yield data that compares results from a known Group IIIA-N HEMT having a drain centered layout (shown as "Prior Art") and a disclosed Group IIIA-N HEMT having a drain centered layout with a disclosed isolation region 110 including a portion positioned between the source and drain contact (shown as "New") so that there is a conduction barrier in a length direction of the drain finger between the drain contact 120*b* of the fingertip 120*a*1 and the source 122. The switching yield can be seen to be >99% for the disclosed Group IIIA-N HEMT as compared to about 72% for the known disclosed Group IIIA-N HEMT.

Disclosed embodiments can be used to form semiconductor die that may be discrete devices or part of integrated circuits integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An electronic device, comprising:
   an active area formed by a group IIIA-N barrier layer over a group IIIA-N active layer;
   a source electrode formed over the active area and having a first portion and a second portion, the first and second portions being parallel and spaced apart, and a third portion connecting the first and second portions;
   a drain electrode formed over the active area and having a drain finger located between the first and second source electrode portions, the drain finger having first and second parallel sides connected via a drain fingertip sidewall; and
   an active area boundary between the active area and an isolation region, the active area boundary located between the drain fingertip sidewall and the third portion of the source electrode.

2. The electronic device as recited in claim 1, wherein the active area boundary is defined by an edge of a mesa structure.

3. The electronic device as recited in claim 2, wherein the edge of the mesa structure is rounded.

4. The electronic device as recited in claim 1, further comprising a plurality of drain contacts connected to the drain finger, wherein the active area boundary is located between the drain fingertip sidewall and the drain contact nearest to the drain fingertip sidewall.

5. The electronic device as recited in claim 1, wherein the active area boundary is defined by an edge of an implanted region.

6. The electronic device as recited in claim 1, wherein the active area boundary is straight and oriented orthogonally to the drain finger.

7. The electronic device as recited in claim 1, further comprising a plurality of source contacts connected to the source electrode and a plurality of drain contacts connected to the drain finger, wherein the drain contact nearest the active area boundary extends further toward the active area boundary than does the source contact nearest the active area boundary.

8. The electronic device as recited in claim 1, further comprising a plurality of source contacts connected to the source electrode and a plurality of drain contacts connected to the drain finger, wherein the isolation region blocks conduction between the source electrode and the drain contact nearest the drain fingertip sidewall through at least a 150 degree arc around the drain contact.

9. The electronic device as recited in claim 1, wherein the isolation region includes two segments that run parallel to the drain finger, and a third segment connected to the first and second segments.

10. The electronic device as recited in claim 1, wherein the drain fingertip sidewall is rounded between the first and second parallel sides.

11. The electronic device as recited in claim 1, wherein the group IIIA-N barrier layer comprises AlGaN and the group IIIA-N active layer comprises GaN.

12. The electronic device as recited in claim 1, wherein the group IIIA-N barrier layer comprises InAlGaN.

13. A method of forming an electronic device, comprising:
   forming an active area comprising a group IIIA-N barrier layer over a group IIIA-N active layer;
   forming a source electrode over the active area, the source electrode having a first portion and a second portion, the first and second portions being parallel and spaced apart, and a third portion connecting the first and second portions;
   forming a drain electrode formed over the active area, the drain electrode having a drain finger located between the first and second source electrode portions, the drain finger having first and second parallel sides connected via a drain fingertip sidewall; and
   forming an isolation region, an active area boundary between the active area and the isolation region being located between the drain fingertip sidewall and the third portion of the source electrode.

14. The method as recited in claim 13, further comprising forming a mesa structure comprising the barrier layer, wherein the active area boundary is defined by an edge of the mesa structure.

15. The method as recited in claim 14, further comprising rounding the edge of the mesa structure by grayscale lithography.

16. The method as recited in claim 13, wherein the active area boundary is located between the drain fingertip sidewall and a drain contact connected to the drain finger.

17. The method as recited in claim 13, wherein the active area boundary is defined by an edge of an implanted region.

18. The method as recited in claim 13, wherein the active area boundary is straight and oriented orthogonally to the drain finger.

19. The method as recited in claim 13, further comprising forming a plurality of source contacts connected to the source electrode and a plurality of drain contacts connected to the drain electrode, wherein a drain contact nearest the active area boundary extends further toward the active area boundary than does the source contact nearest the active area boundary.

20. The method as recited in claim 13, wherein the isolation region includes two segments that run parallel to the drain finger, and a third segment connected to the first and second segments.

* * * * *